(12) United States Patent
Bloemen et al.

(10) Patent No.: US 10,466,404 B2
(45) Date of Patent: Nov. 5, 2019

(54) COLLIMATING ON-DIE OPTIC

(71) Applicant: Lumileds LLC, San Jose, CA (US)

(72) Inventors: Pascal Bloemen, Eindhoven (NL); Maarten van-Lierop, Eindhoven (NL); Rick Nijkamp, Eindhoven (NL); Mark Steltenpool, Eindhoven (NL); Hugo Cornelissen, Eindhoven (NL)

(73) Assignee: LUMILEDS LLC, San Jose, CA (US)

( * ) Notice: Subject to any disclaimer, the term of this patent is extended or adjusted under 35 U.S.C. 154(b) by 177 days.

(21) Appl. No.: 15/590,386

(22) Filed: May 9, 2017

(65) Prior Publication Data

US 2017/0329071 A1 Nov. 16, 2017

Related U.S. Application Data

(60) Provisional application No. 62/335,334, filed on May 12, 2016.

(30) Foreign Application Priority Data

Jul. 5, 2016 (EP) .................................... 16178038

(51) Int. Cl.
*F21V 8/00* (2006.01)
*F21V 7/00* (2006.01)

(52) U.S. Cl.
CPC .......... *G02B 6/0038* (2013.01); *F21V 7/0016* (2013.01); *F21V 7/0033* (2013.01); *G02B 6/0016* (2013.01); *G02B 6/0046* (2013.01)

(58) Field of Classification Search
CPC .. G02B 6/0038; G02B 6/0016; G02B 6/0046; G02B 19/0028; G02B 19/0061;
(Continued)

(56) References Cited

U.S. PATENT DOCUMENTS 7,083,315 B2 * 8/2006 Hansler ................. B64F 1/20
362/559
7,697,219 B2 4/2010 Didomenico
(Continued)

FOREIGN PATENT DOCUMENTS

EP 0117606 A1 9/1984
WO 2015092014 A1 6/2015

OTHER PUBLICATIONS

European Search Report dated Dec. 8, 2016 from European Application No. 16178038.2, filed Jul. 5, 2016, 11 pages.
(Continued)

*Primary Examiner* — Britt D Hanley
*Assistant Examiner* — Nathaniel J Lee
(74) *Attorney, Agent, or Firm* — Volpe and Koenig, P.C.

(57) ABSTRACT

A primary optic for a light-emitting diode or device (LED) includes a tilted wedge atop a truncated compound parabolic concentrator (CPC). The CPC includes an input face and a lower exterior surface defined by a tilted parabolic segment rotated about an axis. The bottom end of the lower exterior surface joins the perimeter of the input face. The tilted wedge includes an upper exterior surface above the lower exterior surface, and an interior conical surface surrounded by the lower and the upper exterior surfaces. The upper exterior surface is defined by a tilted straight line rotated about the axis. The interior conical surface is defined by a smooth curve rotated about the axis. The interior conical surface has a vertex located at the axis and within the lower exterior surface. The top ends of the interior conical surface and the upper exterior surface join to define an output aperture.

15 Claims, 10 Drawing Sheets

(58) Field of Classification Search
CPC ... G02B 19/0066; H01L 33/58; H01L 33/058; F21V 7/0016; F21V 7/0033
See application file for complete search history.

(56) References Cited

U.S. PATENT DOCUMENTS

| | | |
|---|---|---|
| 7,892,268 B2 | 2/2011 | Heacock et al. |
| 9,223,080 B2 | 12/2015 | Holman |
| 2006/0018010 A1 | 1/2006 | Blumel |
| 2007/0041210 A1 | 2/2007 | Ikuno et al. |
| 2008/0285275 A1 | 11/2008 | Ijzerman |
| 2010/0059776 A1 | 3/2010 | Barnes et al. |
| 2010/0226127 A1 | 9/2010 | Bigliatti et al. |
| 2015/0070900 A1 | 3/2015 | Fleming et al. |

OTHER PUBLICATIONS

US as ISA, PCT/US2017/031724 filed May 9, 2017, "International Search Report and Witten Opinion", dated Jul. 19, 2017, 10 pages.

\* cited by examiner

Calculated Parameter  [Input Size (In S) ▼]

Input Size (In S)
[2.5387] mm

Output Size (Out S)
[1.4100] mm

Input Angle (In A)
[57.000] degrees

Output Angle (Out A)
[90.000] degrees

☐ Angle in Material

☑ Angle in Material

Cone Length (CL)
[0.00000] mm

Overall Length (OL)
[2.9560] mm

Origin
[Output Side ▼]

COLLIMATING ON-DIE OPTIC

CROSS-REFERENCE TO RELATED APPLICATIONS

The present application claims priority to U.S. Provisional Patent Application No. 62/335,334, filed May 12, 2016 and European Patent Application No. 16178038.2, filed Jul. 5, 2016. U.S. Provisional Patent Application No. 62/335,334 and European Patent Application No. 16178038.2 are incorporated herein.

FIELD OF THE INVENTION

The present disclosure relates to semiconductor light-emitting diodes or device (LEDs), and more particular to on-die optics for LEDs.

BACKGROUND

In light-emitting diode or device (LED) lighting applications, optic is designed around an LED die to achieve a certain degree of control to where the light is directed. The optics is often mounted separately from the LED die. To reduce this two-stage assembly, an overmold optic is designed to integrate the optic and the LED die. One example of overmold optics is the hemispherical dome molded over the die that increases the extraction efficiency of the LED die but does not redirect the light. Another example is the side-emitter overmold optic that both increases the extraction efficiency and redirects the light from the LED die to deform the radiation pattern from Lambertian to side emitting.

FIG. 1 illustrates a conventional LED package 100. Package 100 includes a heat sink 102, LED dies 104 (only one is labeled), primary optics 106 (only one is labeled) on LED dies 104, and a secondary optic 108 mounted on heat sink 102. LED die 104 may include an LED and a wavelength converter, such as a ceramic phosphor, on the LED. Primary optics 106 are hemispherical dome overmolds that help to extract light from LED dies 104 but does redirect the extracted light. Secondary optic 108 is a reflector that collimates the extracted light as shown in the intensity slice diagram on the figure. Note that 0 degrees corresponds to a direction perpendicular to the top surface of the LED die 104.

SUMMARY

One or more examples of the present disclosure provide an optic that is in optical contact with an LED die and substantially collimates light from the die. The optic is similar in size as the conventional hemispherical dome overmold. The optic includes a truncated compound parabolic concentrator (CPC) and a tilted wedge atop the truncated CPC.

The truncated CPC includes an input face and a lower exterior surface defined by a tilted parabolic segment rotated about an axis of symmetry. The bottom end of the lower exterior surface joins the perimeter of the input face.

The tilted wedge includes an upper exterior surface above the lower exterior surface, and an interior conical surface surrounded by the lower and the upper exterior surfaces. The upper exterior surface is defined by a tilted straight line rotated about the axis of symmetry. The interior conical surface is defined by a parametric curve rotated about the axis of symmetry. The interior conical surface has a vertex located at the axis of symmetry and within the lower exterior surface. The top ends of the interior conical surface and the upper exterior surface join to define an output aperture.

BRIEF DESCRIPTION OF THE DRAWINGS

In the drawings:

FIGS. 3-1 and 3-2 respectively illustrate a cross-sectional side view and an isometric view of an optic of FIG. 2 in examples of the present disclosure.

Use of the same reference numbers in different figures indicates similar or identical elements.

DETAILED DESCRIPTION

Figure 2:
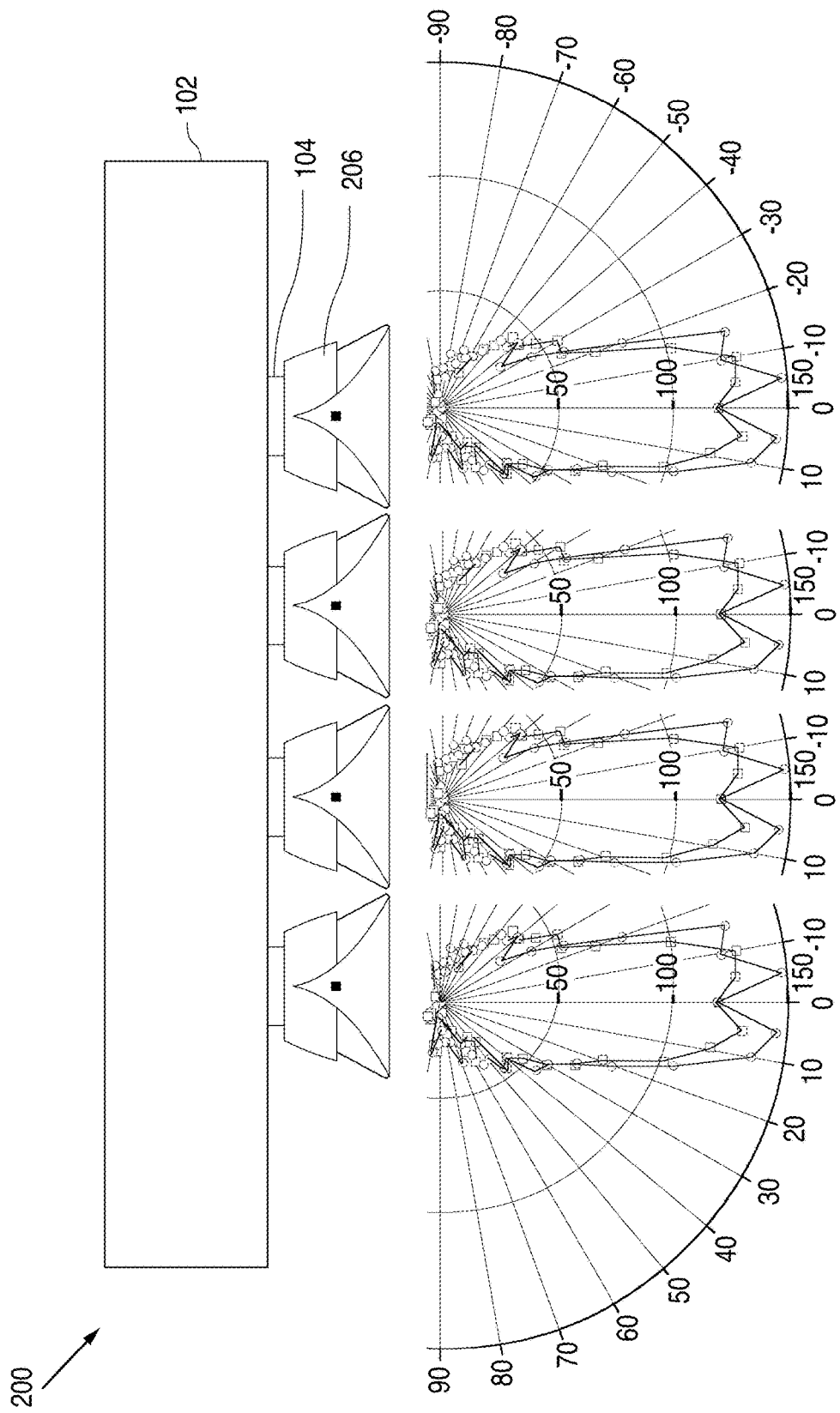
FIG. 2 illustrates a LED package in examples of the present disclosure.

FIG. 2 illustrates a light-emitting diode or device (LED) package 200 in examples of the present disclosure. Package 200 includes heat sink 102, LED dies 104, and optics 206 (only one is labeled) on LED dies 104. Unlike primary optics 106, optics 206 collimates light from LED dies 104. Optics 206 may be printed onto LED dies 104. Alternatively, optics 206 are made individually or as an array, and optics 206 are attached to LED dies 104 individually or as an array.

The beam pattern of optic 206 deviates substantially from the circle pattern that is characteristic of a Lambertian-like emission. Optic 206 may be the sole optic in some applications or a primary optic that redirects light onto a secondary optic in other applications. In either case, light is used more efficiency so that the number of LED dies or the amount of electrical power is reduced.

Figure 1:
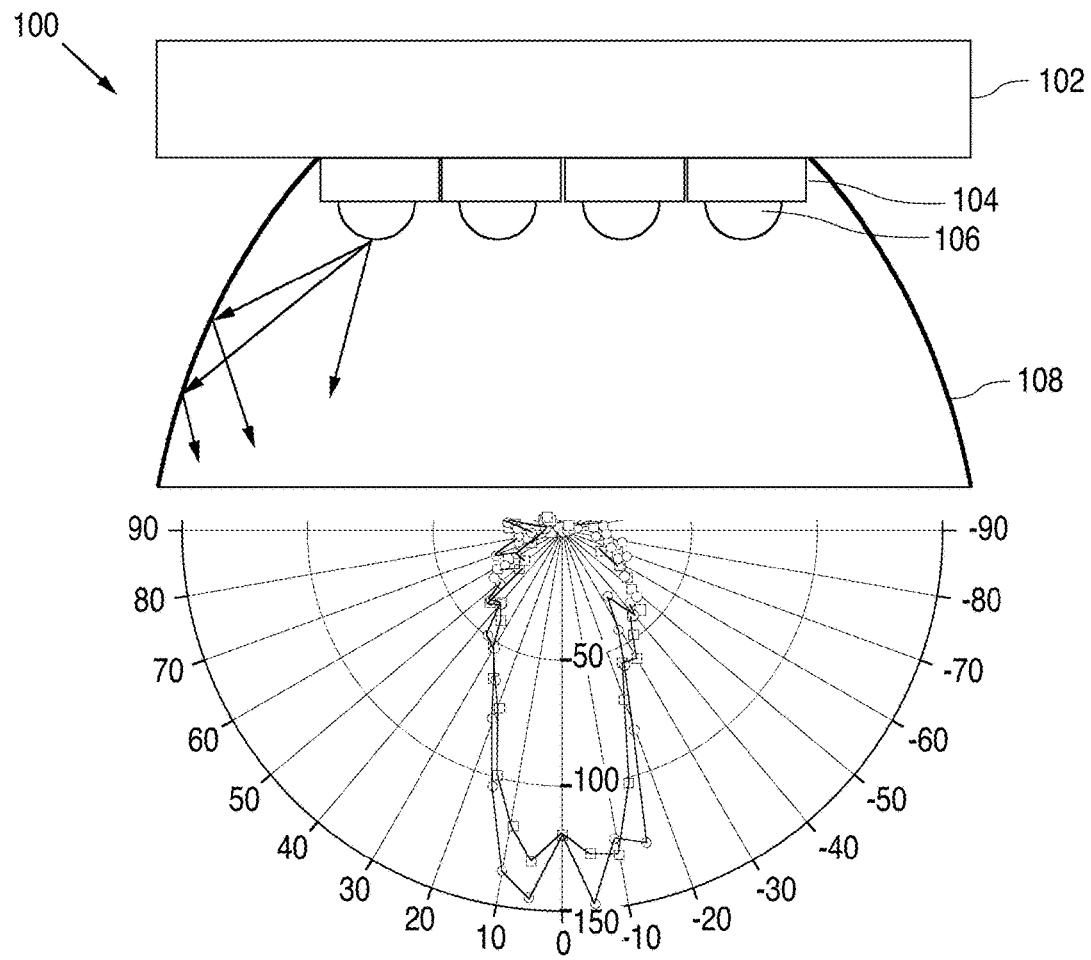
FIG. 1 illustrates a conventional light-emitting diode or device (LED) package.
Figures 1, 3:
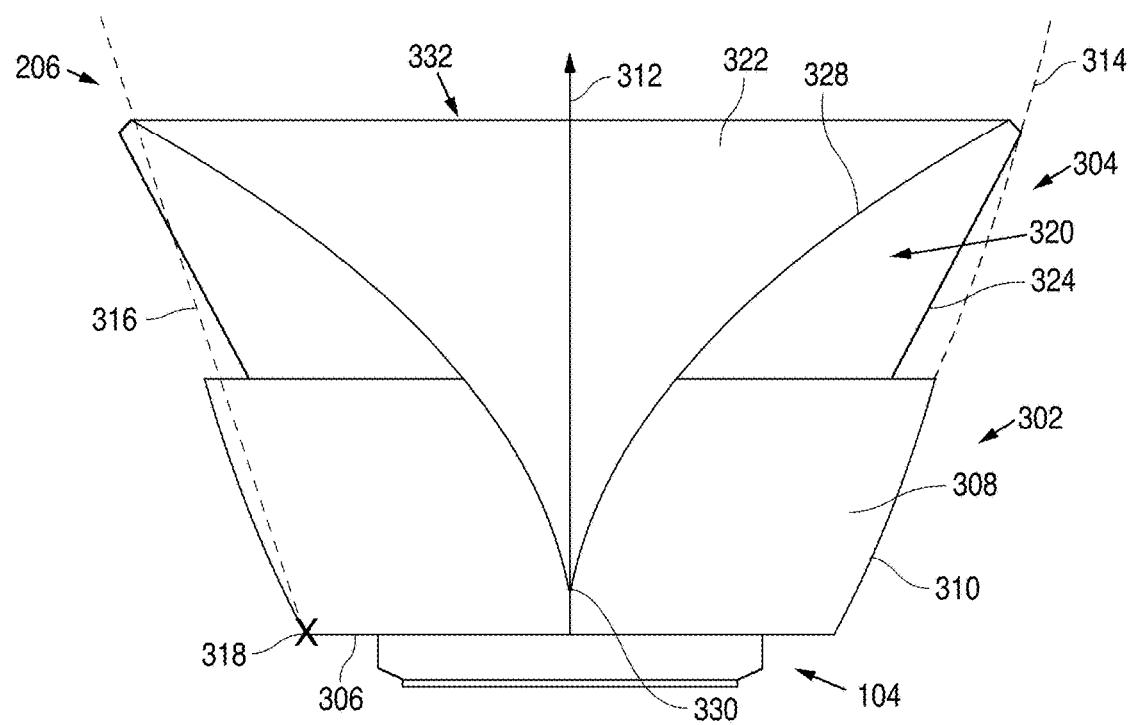
Figures 2, 3:
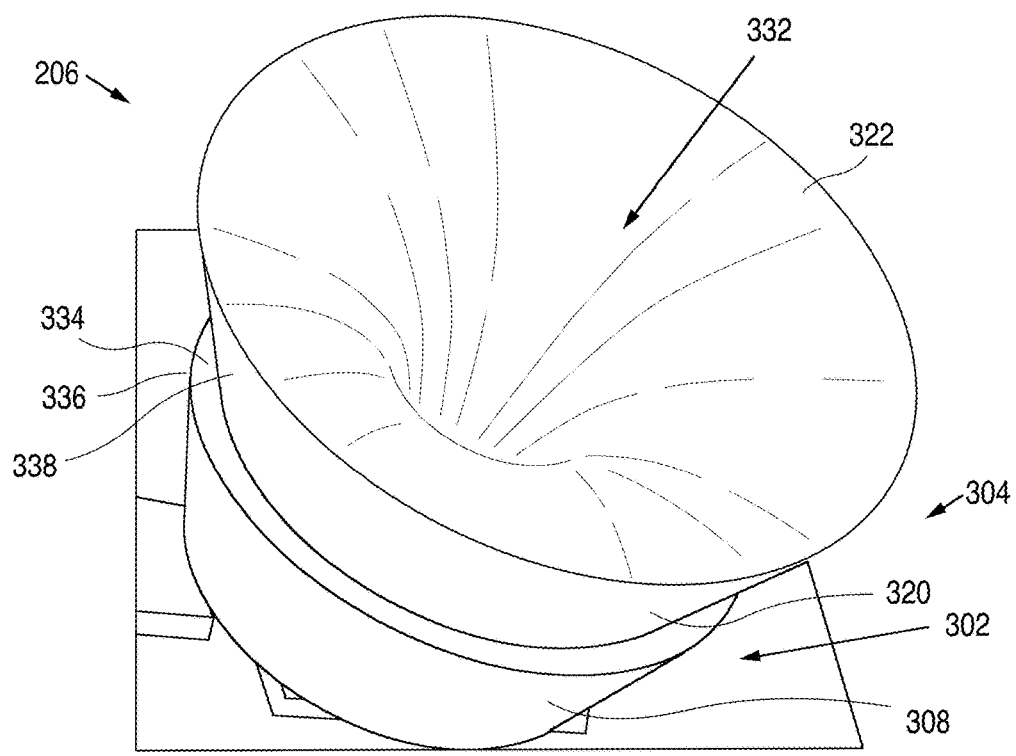

FIGS. 3-1 and 3-2 respectively illustrate a cross-sectional side view and an isometric view of optic 206 in examples of the present disclosure. A truncated three-dimensional compound parabolic concentrator (CPC) 302 forms the bottom and lower portions of optic 206 while a three-dimensional tilted wedge 304 forms the upper and inner portions of optic 206.

Truncated CPC 302 includes a circular input face 306 and a lower exterior surface 308. Input face 306 makes optical contact with LED die 104. Input face 306 is sized to cover LED die 104. Input face 306 may have a diameter that matches or slightly exceeds the longest dimension of the emitting surface of LED die 104. The perimeter of circular input face 306 joins the bottom end of lower exterior surface 308.

Lower exterior surface 308 is defined by a parabolic segment 310 rotated about an axis of symmetry 312. This may also be described as two symmetrical parabolic segments rotated about axis of symmetry 312. Parabolic segment 310 is part of a parabola 314 (shown in phantom) having an optical axis 316 that tilts away from axis of symmetry 312 when travelling upward along optical axis 316. The bottom end of parabola 314 is cut off at the focus 318 of parabola 314, which is located at a far edge of input face 306. The upper end of parabola 314 is cut off at a truncated height less than the height of a full CPC.

Tilted wedge 304 is an optical component formed by rotating a tilted wedge-like cross-section that taper from a thicker lower end to a thinner top end about axis of symmetry 312. Tilted wedge 304 includes an upper exterior surface 320 above lower exterior surface 308 of truncated CPC 302, and an interior conical surface 322 surrounded by upper exterior surface 320 and lower exterior surface 308. Upper exterior surface 320 is defined by a segment 324 rotated about axis of symmetry 312. Segment 324 is straight but may be curved in other examples of the present disclosure. Straight segment 324 tilts away from axis of symmetry 312 when travelling upward along straight segment 324. The top ends of upper exterior surface 320 and interior conical surface 322 join to define an output aperture 332.

Interior conical surface 322 is defined by a line 328 rotated about axis of symmetry 312. Line 328 is a smooth curve but may be straight in other examples of the present disclosure. Smooth curve 328 may be may be a Bezier curve or another mathematical representation of a smooth curve. At least a majority of smooth curve 328 turns away from axis of symmetry 312 when travelling upward along smooth curve 328. A short top end portion of smooth curve 328 may turn toward axis of symmetry 312 when travelling upward along smooth curve 328. Interior conical surface 322 has a vertex 330 located on axis of symmetry 312 within lower exterior surface 308. Vertex 330 may be located on or slightly above input face 306.

An intermediate surface 334 bridges the gap between the larger upper end of lower exterior surface 308 and the smaller lower end of upper exterior surface 320. Intermediate surface 334 may be an annulus having an outer circumference 336 joined to the upper end of the lower exterior surface 308, and an inner circumference 338 joined to the lower end of upper exterior surface 320.

In some examples of the present disclosure, optic 206 is has a compact design comparable to hemispherical dome overmold 106 for LED die 104. This allows optic 206 to be used in many applications designed for hemispheric dome overmold 106.

Figure 4:
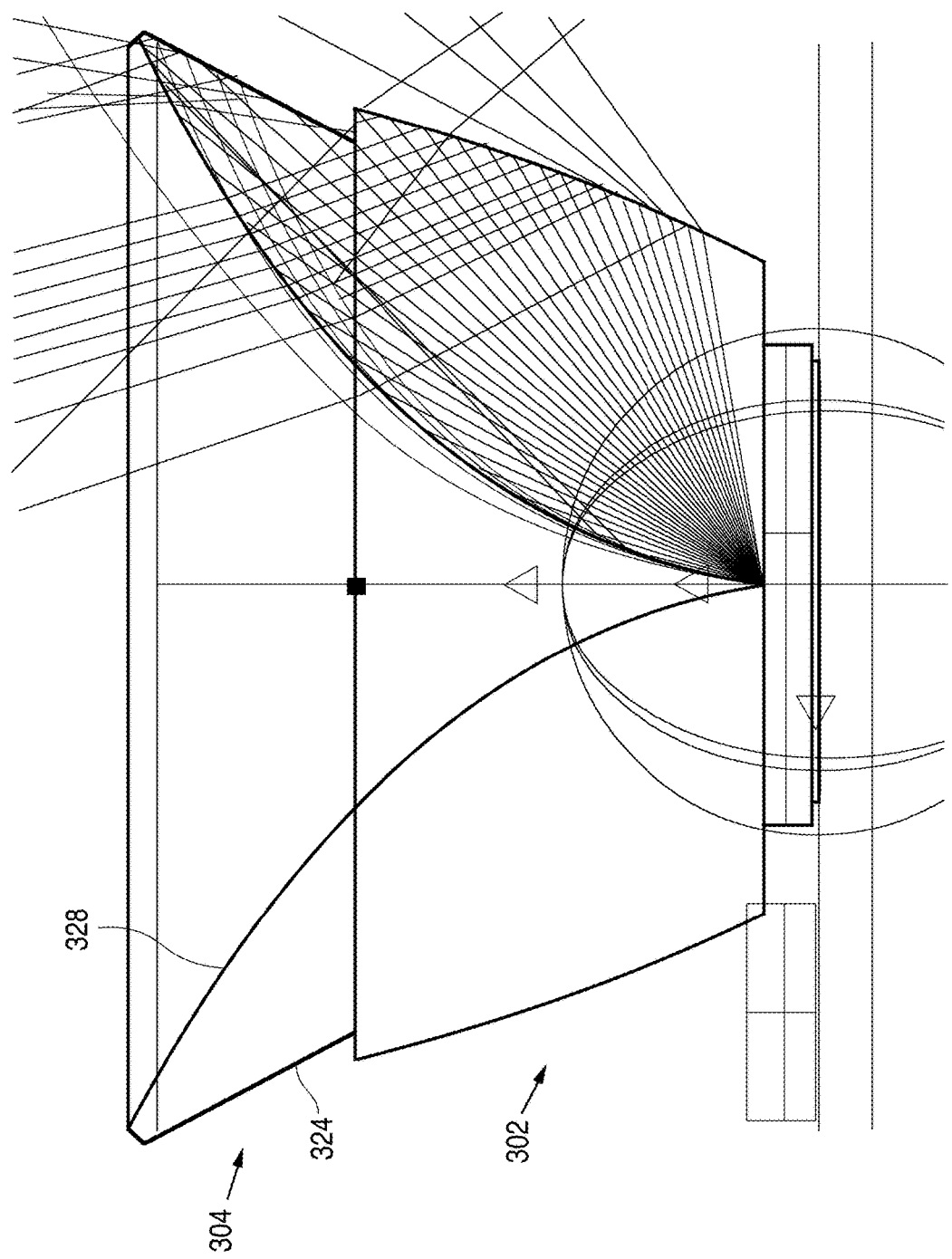
FIG. 4 illustrates ray tracing through the optic of FIG. 2 in examples of the present disclosure.

FIG. 4 illustrates ray tracing through optic 206 in examples of the present disclosure. Smooth curve 328 (labeled on the opposite side for clarify) of tilted wedge 304 reflects some of the rays away from axis of symmetry 312 towards straight segment 324 (labeled on the opposite side for clarify) of tilted wedge 304. Straight segment 324 subsequently redirects the rays along axis of symmetry 312. Some other rays are directly reflected by straight segment 324 along axis of symmetry, but then subsequently slightly diverged by smooth curve 324.

Figure 5:
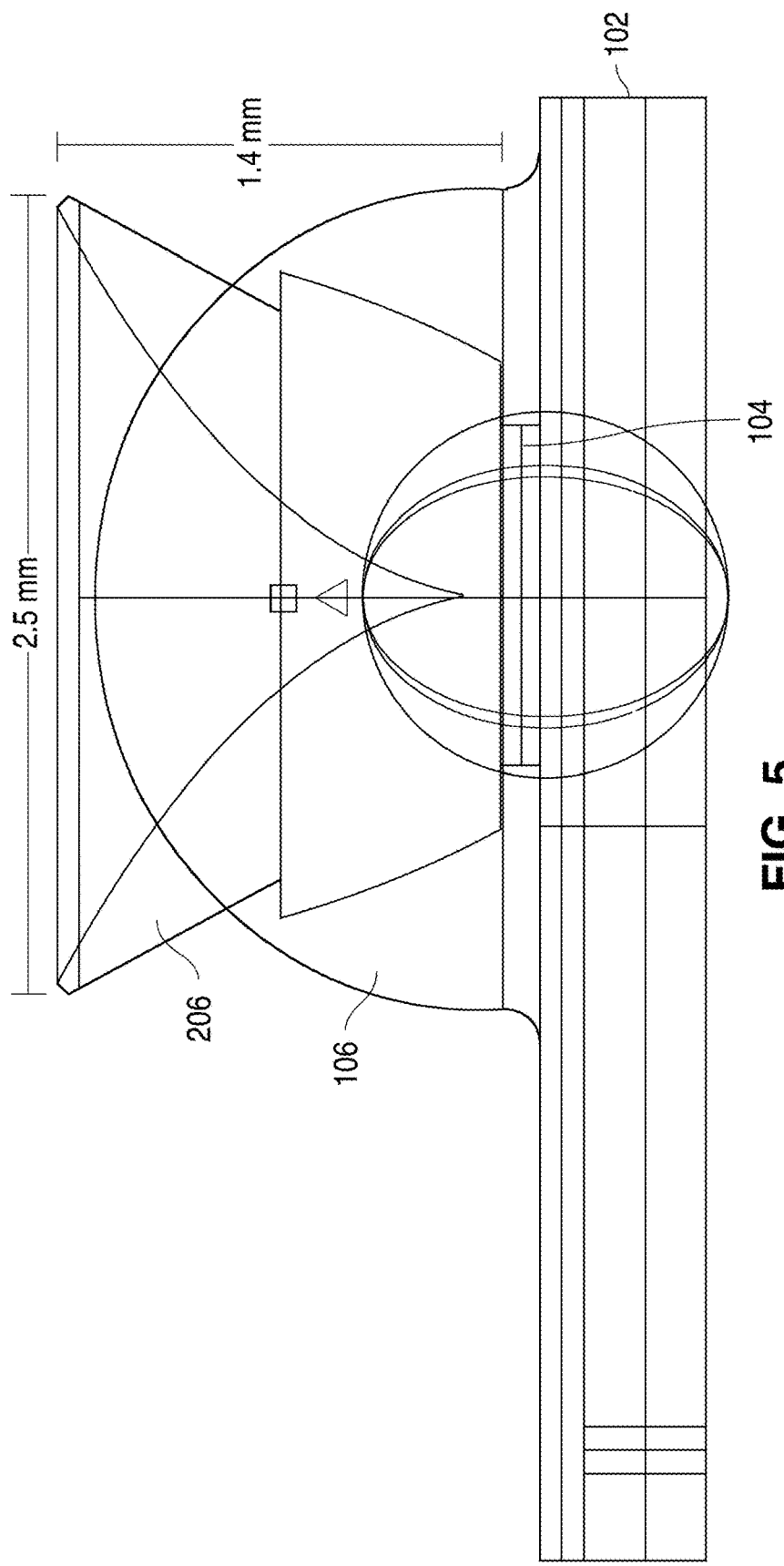
FIG. 5 illustrates that the optic of FIG. 2 has dimensions similar to a conventional hemispherical overmold in some examples of the present disclosure.

FIG. 5 illustrates that optic 206 has height and width that are substantially the same as hemispherical dome overmold 106 in some examples of the present disclosure. For a square LED die 104 having a side of 1 arbitrary unit (arb. unit) and a diagonal of 1.4 arb. unit, hemispherical dome overmold 106 typically has a height of 1.4 arb. unit and a width (diameter) of 2.5 arb. unit. For such a square LED die 104, optic 206 has a height of 1.4 arb. unit and a width (diameter) of 2.5 arb. unit.

Figure 6:
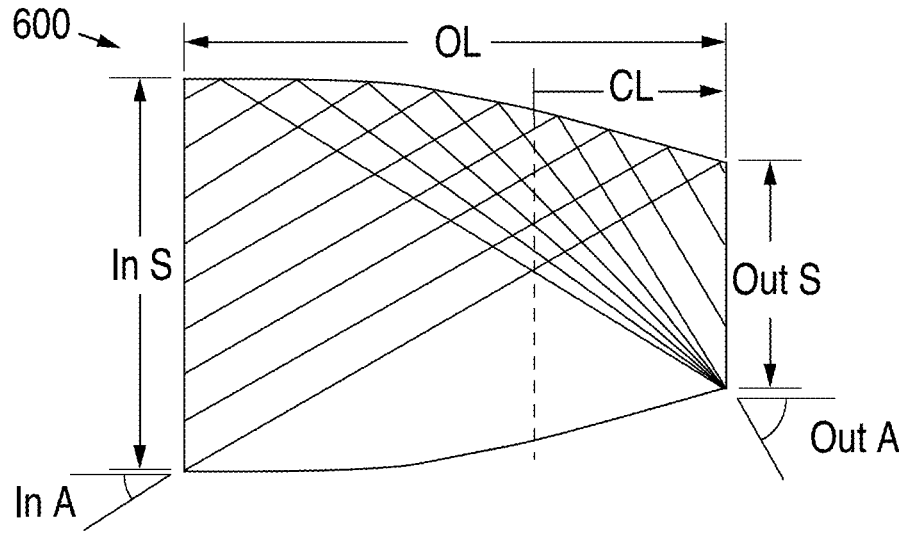
FIG. 6 illustrates the design of a full height compact parabolic concentrator (CPC) cut to form a truncated CPC that forms part of the optic of FIG. 2 in examples of the present disclosure.

FIG. 6 illustrates the design of a full height CPC 600 cut to form truncated CPC 302 in examples of the present disclosure. Note the terminology in FIG. 6 is reversed as CPC 600 is typically used to collect light instead of emit light. Full height CPC 600 has an output size of 1.4100 arb. unit to fully cover LED die 104, an input size of 2.5387 arb. unit to about the height of hemispherical dome overmold 106, an output angle of 90 degrees to collect as much light as possible from LED die 104 that emits a Lambertian pattern from, and a core length of 0 arb. unit. Based on these parameters, full height CPC 600 has an input angle (i.e., acceptance angle) of 57 degrees and an overall length of 2.9560 arb. unit. Note that the cone length is an optional straight line segment that may be added to the tilted parabola. The cone length value depends on the choice of output angle and is 0 for the above parameters. Full height CPC 600 is truncated at a truncated height less than the height of hemispheric dome overmold 106, such as a range from 0.4 to 1.2 arb. unit, to provide space for tilted wedge 304 atop truncated CPC 302. The truncated height may be selected based on ray tracing of optic 206 with various truncated heights.

Figure 7:
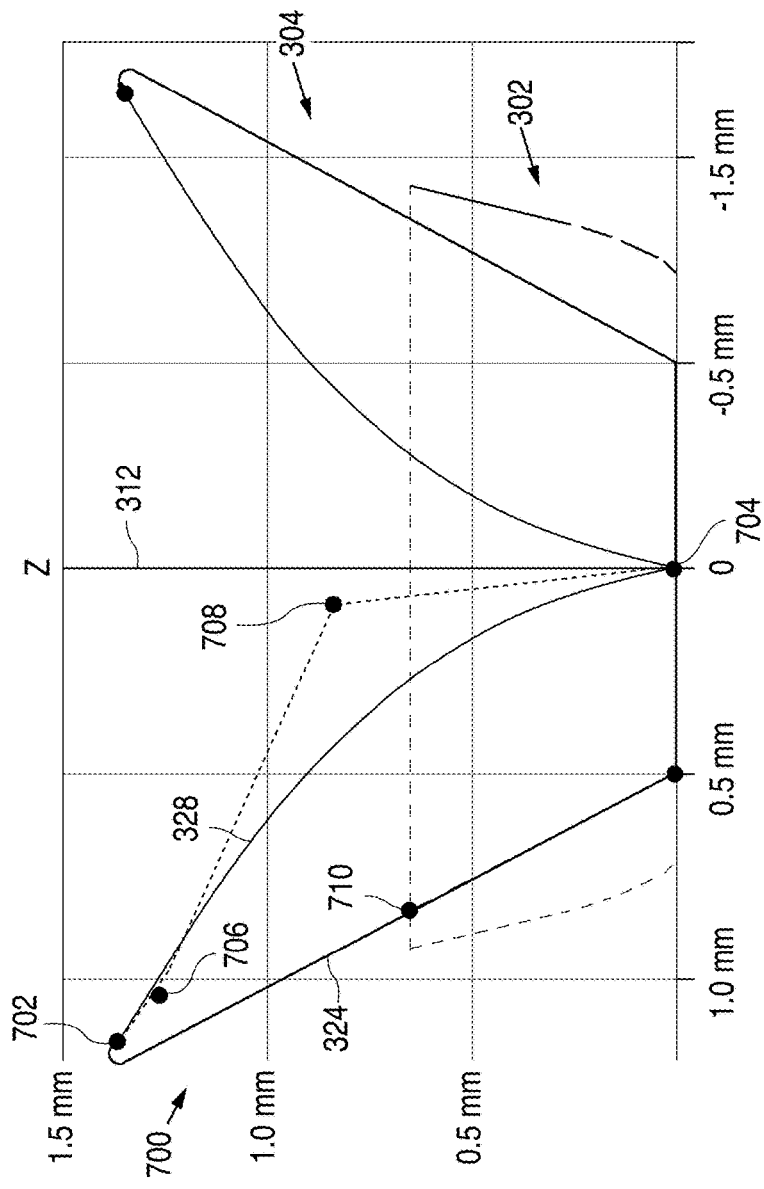
FIG. 7 illustrates the design of a tilted wedge superimposed on the truncated CPC of the optic of FIG. 2 in examples of the present disclosure.

FIG. 7 illustrates the design of tilted wedge 700 superimposed on truncated CPC 302 (shown in phantom) to form optic 206 in examples of the present disclosure. The superimposed portions of tilted wedge 700 form tilted wedge 304. As described above, tilted wedge 304 is defined by rotating straight segment 324 and smooth curve 328 about axis of symmetry 312. When defined as a Bezier curve, smooth curve 328 may have a start point 702, an end point 704, and two control points 706, 708. Start point 702 is selected so the resulting titled wedge 304 has height and width similar to hemispheric dome overmold 106. For example, start point 702 is located at 1.3574 arb. unit in the Z-direction and 1.1574 arb. unit in the Y-direction, and end point 704 is located at the origin. Control point 706 causes a small top end portion smooth curve 328 to turn toward axis of symmetry 312 when travelling upward along smooth curve 328. Control point 706 has a tangent angle of −132.71 degrees, a tangent length of 0.15490 arb. unit, and a weight of 0.55519. Control point 708 causes a majority of smooth curve 328 to turn away from axis of symmetry 312 when travelling upward along smooth curve 328. Control point 708 has a tangent angle of 6.5244 degrees, a tangent length of 0.82236 arb. unit, and a weight of 0.54747. Note the tangent modes for the start and end points describe how closely curve 328 approaches control points 706 and 708, which can be freely defined or automatically defined to smooth fit to the rest of curve.

Straight segment 324 has start point 702 (shared with smooth curve 328) and an end point 710. To avoid a sharp edge along the perimeter of output aperture 332 (FIG. 3), titled wedge 304 may be rounded about start point 702. As tilted wedge 304 is formed atop truncated CPC 302, end point 710 has the truncated height of truncated CPC 302. Straight segment 324 is part of a line that extends from start point 702 to an end point 712 at a side of LED die 104. In other words, the bottom end of tilted wedge 700 is located inside the top surface of LED die 104.

Figure 8:
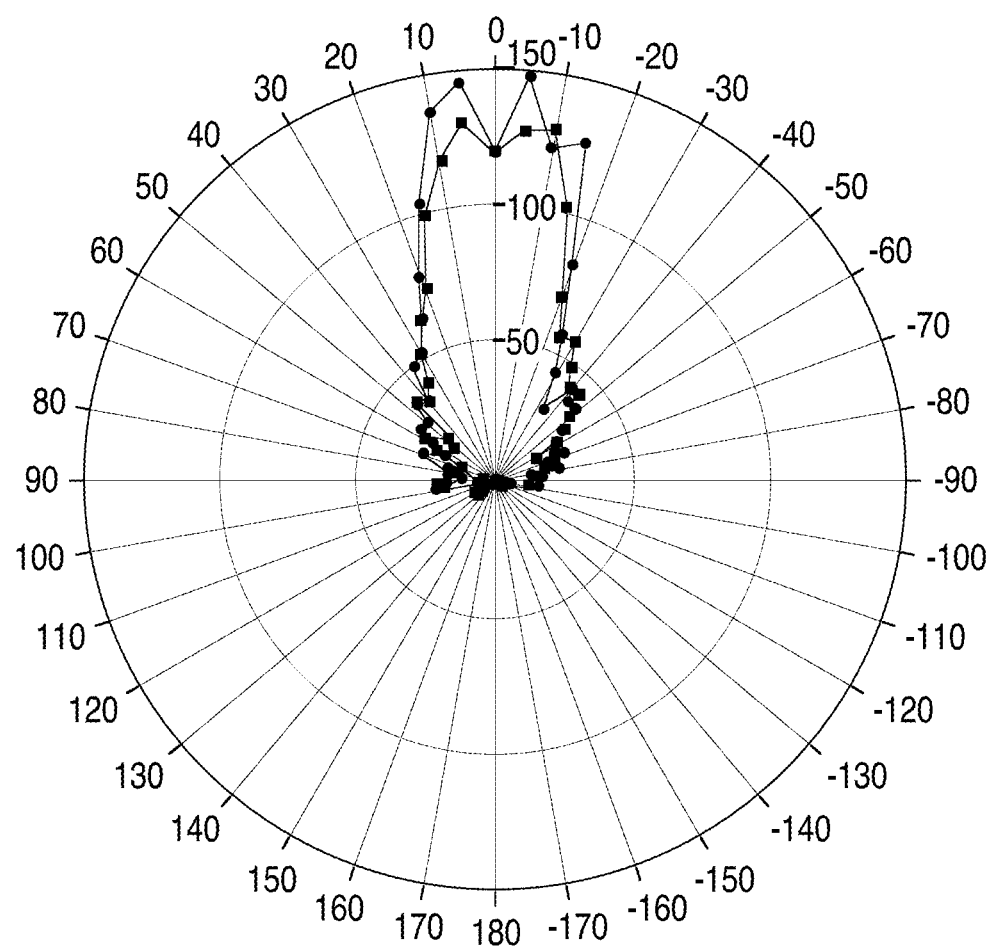
FIGS. 8, 9, and 10 respectively illustrate the far field intensity distribution in intensity slices, the far field intensity distribution in cross-sections, and the forward intensity distribution of the optic of FIG. 2 in examples of the present disclosure.
Figure 9:
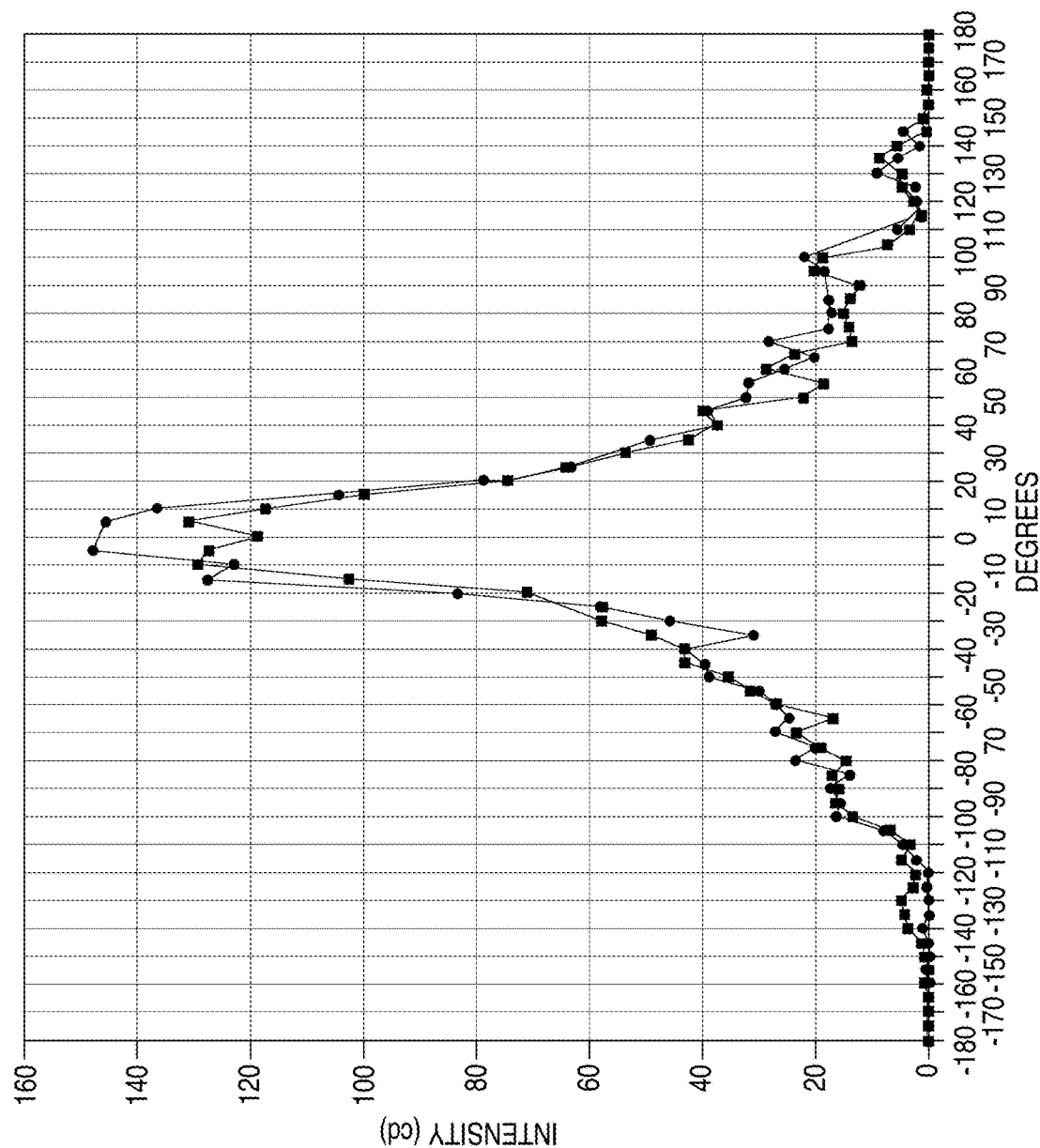
Figure 10:
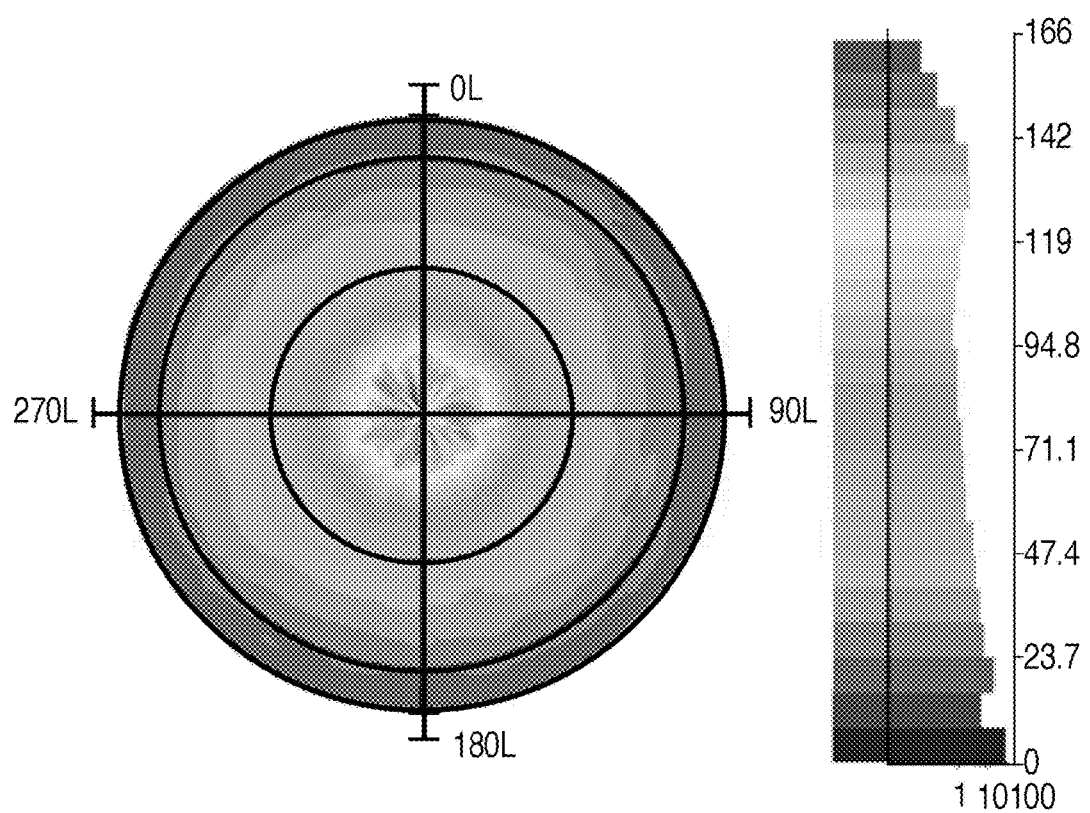

FIGS. 8, 9, and 10 respectively illustrate the far field intensity distribution in intensity slices, the fair field intensity distribution in cross-sections, and the forward intensity distribution of optic 206 in examples of the present disclosure. Optic 206 has a total collected power of 255.68 lumens, a collection efficiency of 7.3533, and a maximum intensity of 158.75 candelas. These numbers are substantially similar to hemispheric dome overmold 106, which has a total collected power of 263.07 lumens, a collection efficiency of 7.5658, and a maximum intensity of 72,267 candelas. Unlike hemispheric dome overmold 106, FIG. 8 shows optic 206 has a high degree of collimation. Unlike a full height CPC or a truncated CPC having the same height as hemispheric dome overmold 106, FIGS. 9 and 10 show that optic 206 does not have a dark center. Thus, optic 206 has a compact design with superior performance than hemispheric dome overmold 106, a full height CPC, or a truncated CPC having the same height as hemispheric dome overmold 106.

Various other adaptations and combinations of features of the embodiments disclosed are within the scope of the invention. Numerous embodiments are encompassed by the following claims.

The invention claimed is:

1. An optic, comprising:
    an input face;
    a lower exterior surface defined by a parabolic segment rotated about an axis of symmetry, the parabolic segment comprising a part of a parabola with an optical axis tilted away from the axis of symmetry when travelling upward along the optical axis, wherein a bottom end of the lower exterior surface joins a perimeter of the input face;
    an upper exterior surface above the lower exterior surface, the upper exterior surface being defined by a line rotated about the axis of symmetry, the line being tilted away from the axis of symmetry when travelling upward along the line; an intermediate surface comprising an annulus, the annulus having an outer circumference that joins an upper end of the lower exterior surface and an inner circumference that joins a lower end of the upper exterior surface; and
    an interior conical surface surrounded by the lower and the upper exterior surfaces, the interior conical surface being defined by a smooth curve rotated about the axis of symmetry, at least a majority of the smooth curve turning away from the axis of symmetry when travelling upward along the smooth curve, wherein:
    the interior conical surface has a vertex located at the axis of symmetry and within the lower exterior surface; and
    top ends of the interior conical surface and the upper exterior surface join to define an output aperture.

2. The optic of claim 1, wherein the lower exterior surface comprises a truncated three-dimensional compound parabolic concentrator.

3. The optic of claim 2, wherein:
    the bottom end of the lower exterior surface forms a first face of the truncated three-dimensional compound parabolic concentrator;
    the truncated three-dimensional compound parabolic concentrator comprises a second face opposite the first face;
    the first face of the truncated three-dimensional compound parabolic concentrator fully covers an LED die having a side of 1 arb. unit and a diagonal of 1.41 arb. unit; and
    the truncated three-dimensional compound parabolic concentrator has an input diameter of 2.54 arb. unit, an output diameter of 1.41 arb. unit, an input angle of 57 degrees, an output angle of 90 degrees, a full length of 2.96 arb. unit, and a truncated height of 0.4 to 1.2 arb. unit.

4. The optic of claim 1, wherein the line rotated about the axis of symmetry is a straight line.

5. The optic of claim 1, wherein:
    the input face fully covers an LED die having a side of 1 arb. unit and a diagonal of 1.41 arb. unit; and
    the smooth curve is a Bezier curve having an end point, a start point located 1.35 arb. unit in a Z-direction and 1.16 arb. unit in a Y-direction from the start point, and two control points.

6. A light-emitting diode (LED) package, comprising:
    a LED the; and
    a optic on the LED die, the optic comprising:
        an input face;
        a lower exterior surface defined by a parabolic segment rotated about an axis of symmetry, the parabolic segment comprising a part of a parabola with an optical axis tilted away from the axis of symmetry when travelling upward along the optical axis, wherein a bottom end of the lower exterior surface joins a perimeter of the input face;
        an upper exterior surface above the lower exterior surface, the upper exterior surface being defined by a line rotated about the axis of symmetry, the line being tilted away from the axis of symmetry when travelling upward along the line;
        an intermediate surface comprising an annulus, the annulus having an outer circumference that joins an upper end of the lower exterior surface and an inner circumference that joins a lower end of the upper exterior surface; and
        an interior conical surface surrounded by the lower and the upper exterior surfaces, the interior conical surface being defined by a smooth curve rotated about the axis of symmetry, at least a majority of the smooth curve turning away from the axis of symmetry when travelling upward along the smooth curve.

7. The package of claim 6, wherein the interior conical surface has a vertex located at the axis of symmetry and within the lower exterior surface, and top ends of the interior conical surface and the upper exterior surface join to define an output aperture.

8. The package of claim 6, wherein:
    the lower exterior surface comprises a truncated three-dimensional compound parabolic concentrator;
    the bottom end of the lower exterior surface forms a first face of the truncated three-dimensional compound parabolic concentrator;
    the truncated three-dimensional compound parabolic concentrator comprises a second face opposite the first face;
    the first face of the truncated three-dimensional compound parabolic concentrator fully covers an LED die having a side of 1 arb. unit and a diagonal of 1.41 arb. unit; and
    the truncated three-dimensional compound parabolic concentrator has an input diameter of 2.54 arb. unit, an output diameter of 1.41 arb. unit, an input angle of 57 degrees, an output angle of 90 degrees, a full length of 2.96 arb. unit, and a truncated height of 0.4 to 1.2 arb. unit.

9. The package of claim 6, wherein:
    the input face fully covers an LED die having a side of 1 arb. unit and a diagonal of 1.41 arb. unit; and the smooth curve is a Bezier curve having an end point, a start point located 1.35 arb. unit in a Z-direction and 1.16 arb. unit in a Y-direction from the start point, and two control points.

10. The LED package of claim 6, further comprising a heat sink, wherein the LED die is mounted on the heat sink.

11. A method for making a light-emitting diode or device (LED) package, comprising:
providing a LED die; and
printing a primary optic on the LED die, comprising:
forming bottom and lower portions of the primary optic comprising a three-dimensional compound parabolic concentrator including:
an input face; and
a lower exterior surface defined by a parabolic segment rotated about an axis of symmetry, the parabolic segment comprising a part of a parabola with an optical axis tilted away from the axis of symmetry when travelling upward along the optical axis, wherein a bottom end of the lower exterior surface joins a perimeter of the input face;
forming upper and inner portions of the primary optic comprising an upper exterior surface above the lower exterior surface, the upper exterior surface being defined by a line rotated about the axis of symmetry, the line being tilted away from the axis of symmetry when travelling upward along the line; an intermediate surface comprising an annulus, the annulus having an outer circumference that joins an upper end of the lower exterior surface and an inner circumference that joins a lower end of the upper exterior surface; and
an interior conical surface surrounded by the lower and the upper exterior surfaces, the interior conical surface being defined by a smooth curve rotated about the axis of symmetry, at least a majority of the smooth curve turning away from the axis of symmetry when travelling upward along the smooth curve.

12. The method of claim 11, wherein the interior conical surface has a vertex located at the axis of symmetry and within the lower exterior surface, and top ends of the interior conical surface and the upper exterior surface join to define an output aperture.

13. The method of claim 11, wherein:
the lower exterior surface comprises a truncated three-dimensional compound parabolic concentrator;
the bottom end of the lower exterior surface forms a face of the truncated three-dimensional compound parabolic concentrator;
the truncated three-dimensional compound parabolic concentrator comprises a second face opposite the first face;
the first face of the truncated three-dimensional compound parabolic concentrator fully covers an LED die having a side of 1 arb. unit and a diagonal of 1.41 arb. unit; and
the truncated three-dimensional compound parabolic concentrator has an input diameter of 2.54 arb. unit, an output diameter of 1.41 arb. unit, an input angle of 57 degrees, an output angle of 90 degrees, a full length of 2.96 arb. unit, and a truncated height of 0.4 to 1.2 arb. unit.

14. The method of claim 11, wherein:
the input face fully covers an LED die having a side of 1 arb. unit and a diagonal of 1.41 arb. unit; and
the smooth curve is a Bezier curve having an end point, a start point located 1.35 arb. unit in a Z-direction and 1.16 arb. unit in a Y-direction from the start point, and two control points.

15. The method of claim 11, further comprising mounting the LED die on a heatsink.

* * * * *